(12) United States Patent
He et al.

(10) Patent No.: US 11,923,380 B2
(45) Date of Patent: Mar. 5, 2024

(54) DISPLAY PANEL WITH LTPO TFT HAVING TOP-GATE OXIDE TFT AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Jiaqing He, Hubei (CN); Jixiang Gong, Hubei (CN); Hao Peng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 232 days.

(21) Appl. No.: 17/275,486

(22) PCT Filed: Nov. 12, 2020

(86) PCT No.: PCT/CN2020/128327
§ 371 (c)(1),
(2) Date: Mar. 11, 2021

(87) PCT Pub. No.: WO2022/082901
PCT Pub. Date: Apr. 28, 2022

(65) Prior Publication Data
US 2022/0310669 A1    Sep. 29, 2022

(30) Foreign Application Priority Data
Oct. 23, 2020 (CN) ......................... 202011150143.2

(51) Int. Cl.
*H01L 27/12* (2006.01)

(52) U.S. Cl.
CPC ...... *H01L 27/1248* (2013.01); *H01L 27/1255* (2013.01); *H01L 27/127* (2013.01)

(58) Field of Classification Search
CPC ............. H01L 27/1248; H01L 27/1255; H01L 27/127; H01L 27/1225; H01L 27/124;
(Continued)

(56) References Cited

U.S. PATENT DOCUMENTS 10,916,185 B1 *  2/2021  Dai .......................... G09G 3/32
2020/0168638 A1   5/2020  Je et al.

FOREIGN PATENT DOCUMENTS

CN    108288621 A       7/2018
CN    108493198 A  *    9/2018   ......... H01L 27/1218
(Continued)

*Primary Examiner* — Duy T Nguyen
*Assistant Examiner* — Zhijun Xu (57) ABSTRACT

A display panel and a manufacturing method thereof are provided. The display panel includes a base substrate, a first active layer, a first gate insulating layer, a first gate layer, and a second gate insulating layer stacked in sequence on the base substrate, and a metal layer, a first interlayer dielectric layer, a first source, and a first drain. A first metal portion and a second metal portion of the metal layer are respectively filled in a first through hole and a second through hole of the second gate insulating layer and are electrically connected to the first active layer.

7 Claims, 4 Drawing Sheets

(58) Field of Classification Search
CPC ............... H01L 27/1259; H01L 29/401; H01L 29/41733; G09F 9/33
See application file for complete search history.

(56) References Cited

FOREIGN PATENT DOCUMENTS

| | | | | | |
|---|---|---|---|---|---|
| CN | 108493198 | A | | 9/2018 | |
| CN | 109300915 | A | | 2/2019 | |
| CN | 109671720 | A | | 4/2019 | |
| CN | 110164868 | A | * | 8/2019 | ............. H01L 27/02 |
| CN | 110164868 | A | | 8/2019 | |
| CN | 110211974 | A | | 9/2019 | |
| CN | 111668239 | A | | 9/2020 | |
| CN | 111725324 | A | | 9/2020 | |

* cited by examiner

DISPLAY PANEL WITH LTPO TFT HAVING TOP-GATE OXIDE TFT AND MANUFACTURING METHOD THEREOF

FIELD OF INVENTION

The present invention relates to the field of display technologies, and in particular, to a display panel and a manufacturing method thereof.

BACKGROUND OF INVENTION

Low temperature polycrystalline oxide (LTPO) technologies combine advantages of low temperature poly-silicon (LTPS) and oxide (for example, metal oxide semiconductors such as IGZO), which form technologies with fast response time and lower power consumption. However, LTPO involves connections of different TFTs, which make manufacturing processes difficult and affect performance of display panels.

Technical Problem

The present invention provides a display panel and a manufacturing method thereof to improve performance of the display panel.

Technical Solution

The present invention provides a display panel, which comprises:
  a base substrate;
  a first active layer, a first gate insulating layer, a first gate layer, and a second gate insulating layer; wherein the first active layer, the first gate insulating layer, the first gate layer, and the second gate insulating layer are stacked in sequence on the base substrate, the second gate insulating layer is provided with a first through hole and a second through hole, the first through hole passes through the second gate insulating layer and the first gate insulating layer and exposes a portion of a side of the first active layer, and the second through hole passes through the second gate insulating layer and the first gate insulating layer and exposes a portion of another side of the first active layer;
  a metal layer, wherein the metal layer comprises a first metal portion and a second metal portion, the first metal portion is filled in the first through hole and is electrically connected to the portion of the side of the first active layer, and the second metal portion is filled in the second through hole and is electrically connected to the portion of another side of the first active layer;
  a first interlayer dielectric layer, wherein the first interlayer dielectric layer covers the second gate insulating layer and the metal layer, the first interlayer dielectric layer is provided with a third through hole and a fourth through hole, the third through hole passes through the first interlayer dielectric layer and exposes the first metal portion, and the fourth through hole passes through the first interlayer dielectric layer and exposes the second metal portion;
  a first source, wherein the first source is disposed in the third through hole and is electrically connected to the first metal portion; and
  a first drain, wherein the first drain is disposed in the fourth through hole and is electrically connected to the second metal portion.

In the display panel provided by the present invention, the metal layer further comprises a third metal portion, the third metal portion is disposed on the second gate insulating layer and located on the first gate layer, the third metal portion is insulated from the first metal portion and the second metal portion, and the first gate layer and the third metal portion form a storage capacitor; and
  the first active layer, the first gate insulating layer, the first gate layer, the second gate insulating layer, the metal layer, the first interlayer dielectric layer, the first source, and the second drain form a first transistor.

In the display panel provided by the present invention, the display panel further comprises a second active layer and a third gate insulating layer, wherein the second active layer and the third gate insulating layer are disposed on the first interlayer dielectric layer in sequence; and
  a projection of the second active layer projected on the base substrate does not overlap a projection of the first active layer projected on the base substrate, and the third through hole and the fourth through hole further pass through the third gate insulating layer.

In the display panel provided by the present invention, the display panel further comprises a second gate layer, wherein the second gate layer is disposed on the third gate insulating layer and on the second active layer.

In the display panel provided by the present invention, the display panel further comprises a second interlayer dielectric layer, wherein the second interlayer dielectric layer covers the third gate insulating layer and the second gate layer; and
  the third through hole further passes through the second interlayer dielectric layer, and the fourth through hole further passes through the second interlayer dielectric layer; the second interlayer dielectric layer is provided with a first via hole and a second via hole, the first via hole passes through the second interlayer dielectric layer and the third gate insulating layer and exposes a portion of a side of the second active layer, and the second via hole passes through the second interlayer dielectric layer and the third gate insulating layer and exposes a portion of another side of the second active layer.

In the display panel provided by the present invention, the display panel further comprises a second source and a second drain, the second source is disposed on the second interlayer dielectric layer and extends into the first via hole to be electrically connected to the second active layer, the second drain is disposed on the second interlayer dielectric layer and extends into the second via hole to be electrically connected to the second active layer, and the first source, the first drain, the second source, and the second drain are disposed in a same layer.

In the display panel provided by the present invention, the display panel further comprises a passivation layer, wherein the passivation layer covers the second interlayer dielectric layer, the first source, the first drain, the second source, and the second drain.

In the display panel provided by the present invention, the display panel further comprises a planarization layer, wherein the planarization layer is disposed on the passivation layer, the planarization layer is provided with a third via hole, and the third via hole passes through the planarization layer and exposes the first drain.

In the display panel provided by the present invention, the display panel further comprises an anode layer, wherein the anode layer is disposed on the planarization layer and extends into the third via hole to be electrically connected to the first drain.

In the display panel provided by the present invention, the display panel further comprises a pixel definition layer, wherein the pixel definition layer covers the planarization layer and the anode layer, the pixel definition layer is provided with a fourth via hole, and the fourth via hole passes through the pixel definition layer to expose the anode layer.

In the display panel provided by the present invention, the display panel further comprises a light-emitting portion, wherein the light-emitting portion is disposed in the fourth via hole to be electrically connected to the anode layer.

In the display panel provided by the present invention, the display panel further comprises a retaining wall, wherein the retaining wall is disposed on the pixel definition layer and located around the fourth via hole.

The present invention further provides a manufacturing method of a display panel, which comprises following steps:
  providing a base substrate;
  stacking a first active layer, a first gate insulating layer, a first gate layer, and a second gate insulating layer in sequence on the base substrate;
  etching the second gate insulating layer to form a first through hole and a second through hole, wherein the first through hole passes through the second gate insulating layer and the first gate insulating layer and exposes a portion of a side of the first active layer, and the second through hole passes through the second gate insulating layer and the first gate insulating layer and exposes a portion of another side of the first active layer;
  forming a patterned metal layer on the second gate insulating layer, wherein the metal layer comprises a first metal portion and a second metal portion, the first metal portion is electrically connected to the portion of the side of the first active layer through the first through hole, and the second metal portion is electrically connected to the portion of another side of the first active layer through the second through hole;
  forming a first interlayer dielectric layer on the metal layer;
  etching the first interlayer dielectric layer to form a third through hole and a fourth through hole, wherein the third through hole passes through the first interlayer dielectric layer and exposes the first metal portion, and the fourth through hole passes through the first interlayer dielectric layer and exposes the second metal portion; and
  forming a first source and a first drain on the first interlayer dielectric layer, wherein the first source extends into the third through hole and is electrically connected to the first metal portion, and the first drain extends into the fourth through hole and is electrically connected to the second metal portion.

In the manufacturing method of the display panel provided by the present invention, after the step of etching the second gate insulating layer to form the first through hole and the second through hole, and before the step of forming the patterned metal layer on the second gate insulating layer, the method further comprises:
  cleaning the first through hole and the second through hole.

In the manufacturing method of the display panel provided by the present invention, after the step of forming the first interlayer dielectric layer on the metal layer, and before the step of etching the first interlayer dielectric layer to form the third through hole and the fourth through hole, the method further comprises:
  disposing a second active layer on the first interlayer dielectric layer, wherein projections of the second active layer and the first active layer projected on the base substrate do not overlap.

In the manufacturing method of the display panel provided by the present invention, after the step of disposing the second active layer on the first interlayer dielectric layer, the method further comprises:
  disposing a third gate insulating layer on the first interlayer dielectric layer and the second active layer;
  disposing a second gate layer on the third gate insulating layer;
  disposing a second interlayer dielectric layer on the second gate layer, wherein the third through hole and the fourth through hole further pass through the third gate insulating layer and the second interlayer dielectric layer; and
  forming a first source, a first drain, a second source, and a second drain on the second interlayer dielectric layer, wherein the first source is electrically connected to the first metal portion, the first drain is electrically connected to the second metal portion, and the second source and the second drain are electrically connected to the second active layer.

In the manufacturing method of the display panel provided by the present invention, after the step of forming the first source, the first drain, the second source, and the second drain on the second interlayer dielectric layer, the method further comprises:
  forming a passivation layer on the second interlayer dielectric layer, the first source, the first drain, the second source, and the second drain.

In the manufacturing method of the display panel provided by the present invention, after the step of forming the passivation layer on the second interlayer dielectric layer, the first source, the first drain, the second source, and the second drain, the method further comprises:
  forming a planarization layer on the passivation layer, wherein the planarization layer is provided with a third via hole, and the third via hole passes through the planarization layer and exposes the first drain.

In the manufacturing method of the display panel provided by the present invention, after the step of forming the planarization layer on the passivation layer, the method further comprises:
  disposing an anode layer on the planarization layer, wherein the anode layer extends into the third via hole to be electrically connected to the first drain.

In the manufacturing method of the display panel provided by the present invention, after the step of disposing the anode layer on the planarization layer, the method further comprises:
  forming a pixel definition layer on the planarization layer and the anode layer, wherein the pixel definition layer is provided with a fourth via hole, and the fourth via hole passes through the pixel definition layer to expose the anode layer.

Beneficial Effect

The present invention provides a display panel and a manufacturing method thereof. A first metal portion and a second metal portion are electrically connected to a first active layer, and then a first source and a first drain are electrically connected to the first active layer through the first metal portion and the second metal portion. This prevents damage to the exposed first active layer in a subsequent manufacturing process, thereby ensuring display performance of the display panel and reducing difficulty of the manufacturing process.

DESCRIPTION OF DRAWINGS

The following detailed description of specific embodiments of the present invention in conjunction with accompanying drawings will make technical solutions and other beneficial effects of the present invention obvious.

DETAILED DESCRIPTION OF PREFERRED EMBODIMENTS

The present invention will be further described in detail below with reference to the accompanying drawings and embodiments. In particular, the following examples are only intended to illustrate the invention, but do not limit the scope of the invention. In the same manner, the following embodiments are only partial embodiments rather than all embodiments of the present invention, and all other embodiments obtained by those skilled in the art without creative efforts are within the scope of the present invention.

Figure 1:
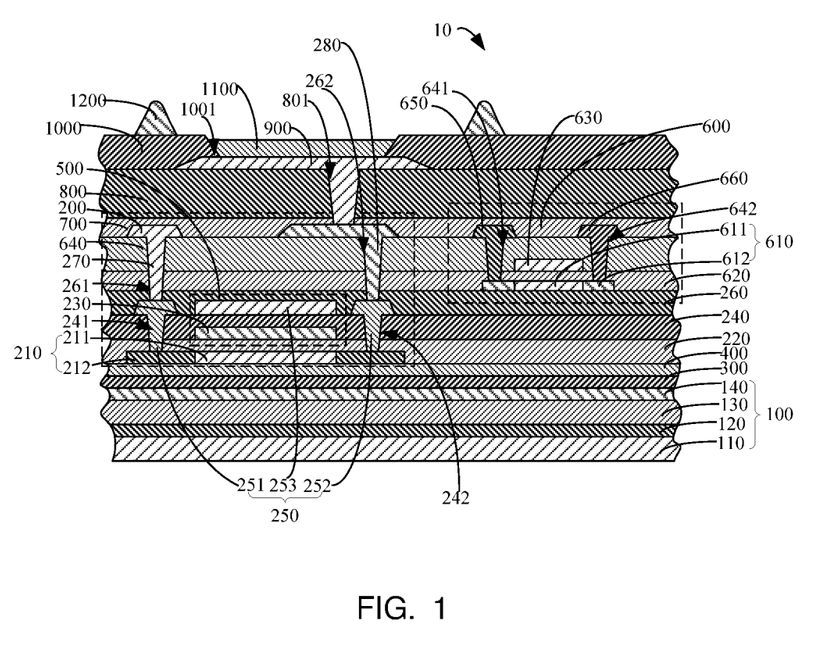
FIG. 1 is a schematic view of a first cross-sectional structure of a display panel provided by an embodiment of the present invention.

Please refer to FIG. 1. FIG. 1 is a schematic view of a first cross-sectional structure of a display panel provided by an embodiment of the present invention. The embodiment of the present invention provides a display panel 10. The display panel 10 comprises a base substrate 100, a first active layer 210, a first gate insulating layer 220, a first gate layer 230, a second gate insulating layer 240, a metal layer 250, a first interlayer dielectric layer 260, a first source 270, and a first drain 280. The specific description is as follows:

The base substrate 100 comprises a first flexible layer 110, a first buffer layer 120, a second flexible layer 130, and a second buffer layer 140. The first buffer layer 120 is disposed on the first flexible layer 110. The second flexible layer 130 is disposed on the first buffer layer 120. The second buffer layer 140 is disposed on the second flexible layer 130. Materials of the first flexible layer 110 and the second flexible layer 130 are polyimide or other flexible materials. Materials of the first buffer layer 120 and the second buffer layer 140 are one or a combination of at least two of SiOx and SiOy. The base substrate 100 is alternately formed with flexible layers and buffer layers, which improves bendability of the base substrate and at the same time prevents a structure in the display panel from being corroded by water and oxygen.

In the embodiment, the display panel 10 further comprises a first insulating layer 300 and a second insulating layer 400. The first insulating layer 300 is disposed on the second buffer layer 140. The second insulating layer 400 is disposed on the first insulating layer 300. Materials of the first insulating layer 300 and the second insulating layer 400 is one or a combination of at least two of SiOx and SiOy. The first insulating layer 300 and the second insulating layer 400 further prevent the display panel 10 from being corroded by water and oxygen.

The first active layer 210, the first gate insulating layer 220, the first gate 230, and the second gate insulating layer 240 are stacked on the base substrate 100 in sequence. The first active layer 210 comprises a semiconductor portion 211 and a conductor portion 212. The conductor portion 212 is disposed on two sides of the semiconductor portion 211. A material of the first active layer 210 is amorphous silicon. Materials of the first gate layer 230 is one or a combination of at least two of Cu, Al, and Mo. The second gate insulating layer 240 is provided with a first through hole 241 and a second through hole 242. The first through hole 241 passes through the second gate insulating layer 240 and the first gate insulating layer 220 and exposes a portion of a side of the first active layer 210. The second through hole 242 passes through the second gate insulating layer 240 and the first gate insulating layer 220 and exposes a portion of another side of the first active layer 210.

The metal layer 250 comprises a first metal portion 251 and a second metal portion 252. The first metal portion 251 is disposed on the second gate insulating layer 240 and extends into the first through hole 241 to be electrically connected to the portion of the side of the first active layer 210. The second metal portion 252 is disposed on the second gate insulating layer 240 and extends into the second through hole 242 to be electrically connected to the portion of another side of the first active layer 210. A material of the metal layer 250 is one or a combination of at least two of Cu, Al, and Mo.

In the present invention, the first metal portion and the second metal portion are provided in the display panel to prevent a second transistor from damaging the first active layer exposed to the first through hole and the second through hole when the second active layer is subjected to subsequent processing, such as, for example, plasma processing or modulation of characteristics of the second transistor, resulting in an abnormal electrical connection of the first source and the second drain, ensuring a normal electrical connection of the display panel, and thus ensuring performance of the display panel.

In an embodiment, the metal layer 250 further comprises a third metal portion 253. The third metal portion 253 is disposed on the second gate insulating layer 240 and above the first gate layer 230. The third metal portion 253 is insulated from the first metal portion 251 and the second metal portion 252. The first gate layer 230 and the third metal portion 253 form a storage capacitor 500.

The first interlayer dielectric layer 260 covers the second gate insulating layer 240 and the metal layer 250. The first interlayer dielectric layer 260 is provided with a third through hole 261 and a fourth through hole 262. The third through hole 261 passes through the first interlayer dielectric layer 260 and exposes the first metal portion 251. The fourth through hole 262 passes through the first interlayer dielectric layer 260 and exposes the second metal portion 252.

The first source 270 is disposed on the first interlayer dielectric layer 260 and extends into the third through hole 261 to be electrically connected to the first metal portion 251.

The first drain 280 is disposed on the first interlayer dielectric layer 260 and extends into the fourth through hole 262 to be electrically connected to the second metal portion 252.

The first active layer 210, the first gate insulating layer 220, the first gate layer 230, the second gate insulating layer

240, the first metal portion 251, the second metal portion 252, the first interlayer dielectric layer 260, the first source 270, and the second drain 280 form a first transistor 200. The first transistor 200 is a low temperature polysilicon transistor.

In an embodiment, the display panel 10 further comprises a second active layer 610 and a third gate insulating layer 620. The second active layer 610 and the third gate insulating layer 620 are disposed on the first interlayer dielectric layer 260 in sequence. The second active layer 610 comprises a body portion 611 and doped portions 612 disposed on two sides of the body portion 611. A material of the second active layer 610 is indium gallium zinc oxide (IGZO).

A projection of the second active layer 610 projected on the base substrate 100 and a projection of the first active layer 210 projected on the base substrate 100 do not overlap. The third through hole 261 and the fourth through hole 262 also pass through the third gate insulating layer 620.

In an embodiment, the display panel 10 further comprises a second gate layer 630. The second gate layer 630 is disposed on the third gate insulating layer 620 and above the second active layer 610.

In an embodiment, the display panel 10 further comprises a second interlayer dielectric layer 640. The second interlayer dielectric layer 640 covers the third gate insulating layer 620 and the second gate layer 630.

The third through hole 261 also passes through the second interlayer dielectric layer 640. The fourth through hole 262 also passes through the second interlayer dielectric layer 640. The second interlayer dielectric layer 640 is provided with a first via hole 641 and a second via hole 642. The first via hole 641 passes through the second interlayer dielectric layer 640 and the third gate insulating layer 620 and exposes a portion of a side of the second active layer 610. The second via hole 642 passes through the second interlayer dielectric layer 640 and the third gate insulating layer 620 and exposes a portion of another side of the second active layer 610. The first source 270 is disposed on the second interlayer dielectric layer 640 and extends into the third through hole 261 to be electrically connected to the first metal portion 251. The first drain 280 is disposed on the second interlayer dielectric layer 640 and extends into the fourth through hole 262 to be electrically connected to the second metal portion 252.

In an embodiment, the display panel 10 further comprises a second source 650 and a second drain 660. The second source 650 is disposed on the second interlayer dielectric layer 640 and extends into the first via hole 641 to be electrically connected to the second active layer 610. The second drain 660 is disposed on the second interlayer dielectric layer 640 and extends into the second via hole 642 to be electrically connected to the second active layer 610. The first source 270, the first drain 280, the second source 650, and the second drain 660 are disposed in a same layer. The second active layer 610, the third gate insulating layer 620, the second gate layer 630, the second interlayer dielectric layer 640, the second source 650, and the second drain 660 form a second transistor 600. The second transistor 600 is a metal oxide transistor.

In the present invention, the first metal portion and the second metal portion are electrically connected to the first active layer, the first source, and the first drain in the display panel to prevent damage to the second transistor during the cleaning or annealing process of the third via hole and fourth via hole of the first transistor, thus ensuring display performance of the display panel and reducing difficulty of a manufacturing process.

In an embodiment, the display panel 10 further comprises a passivation layer 700. The passivation layer 700 covers the second interlayer dielectric layer 640, the first source 270, the first drain 280, the second source 650, and the second drain 660.

In an embodiment, the display panel 10 further comprises a planarization layer 800. The planarization layer 800 is disposed on the passivation layer 700. The planarization layer 800 is provided with a third via hole 801. The third via hole 801 passes through the planarization layer 800 and exposes the first drain 280.

In an embodiment, the display panel 10 further comprises an anode layer 900. The anode layer 900 is disposed on the planarization layer 800 and extends into the third via hole 801 to be electrically connected to the first drain 280.

In an embodiment, the display panel 10 further comprises a pixel definition layer 1000. The pixel definition layer 1000 covers the planarization layer 800 and the anode layer 900. The pixel definition layer 1000 is provided with a fourth via hole 1001. The fourth via hole 1001 passes through the pixel definition layer 1000 to expose the anode layer 900.

In an embodiment, the display panel 10 further comprises a light-emitting portion 1100. The light-emitting portion 1100 is disposed in the fourth via hole 1001 to be electrically connected to the anode layer 900.

In an embodiment, the display panel 10 further comprises a retaining wall 1200. The retaining wall 1200 is disposed on the pixel definition layer 1000 and is located around the fourth via hole 1001.

Figure 2:
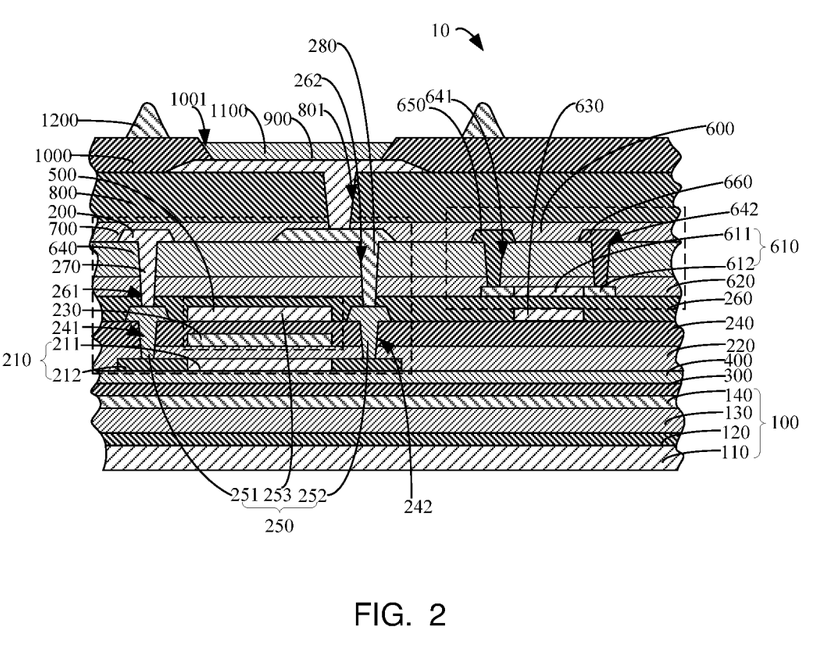
FIG. 2 is a schematic view of a second cross-sectional structure of the display panel provided by the embodiment of the present invention.

Please refer to FIG. 2. FIG. 2 is a schematic view of a second cross-sectional structure of the display panel provided by the embodiment of the present invention. It should be noted that a difference between FIG. 2 and FIG. 1 is that: the second gate layer 630 is disposed on the second gate insulating layer 240 and is disposed in a same layer as the metal layer 250. The second gate layer 240 is located under the second active layer 610. The material of the second gate layer 240 is same as the material of the metal layer 250, and other structures are as described in FIG. 1 and will not be repeated here.

In the present invention, the second gate layer and the metal layer can be formed in a same layer and can be formed by a same mask, which reduces production costs.

In the present invention, by providing secondary holes in the display panel, e.g., the first through hole and the second through hole filling the first metal portion and the second metal portion, and the third through hole and the fourth through hole filling the first source and the first drain, damage to the first active layer by a deep-hole process is prevented, and thus an abnormal electrical connection between the first source and the first drain is prevented, thus ensuring the display performance of the display panel and reducing costs.

Figure 3:
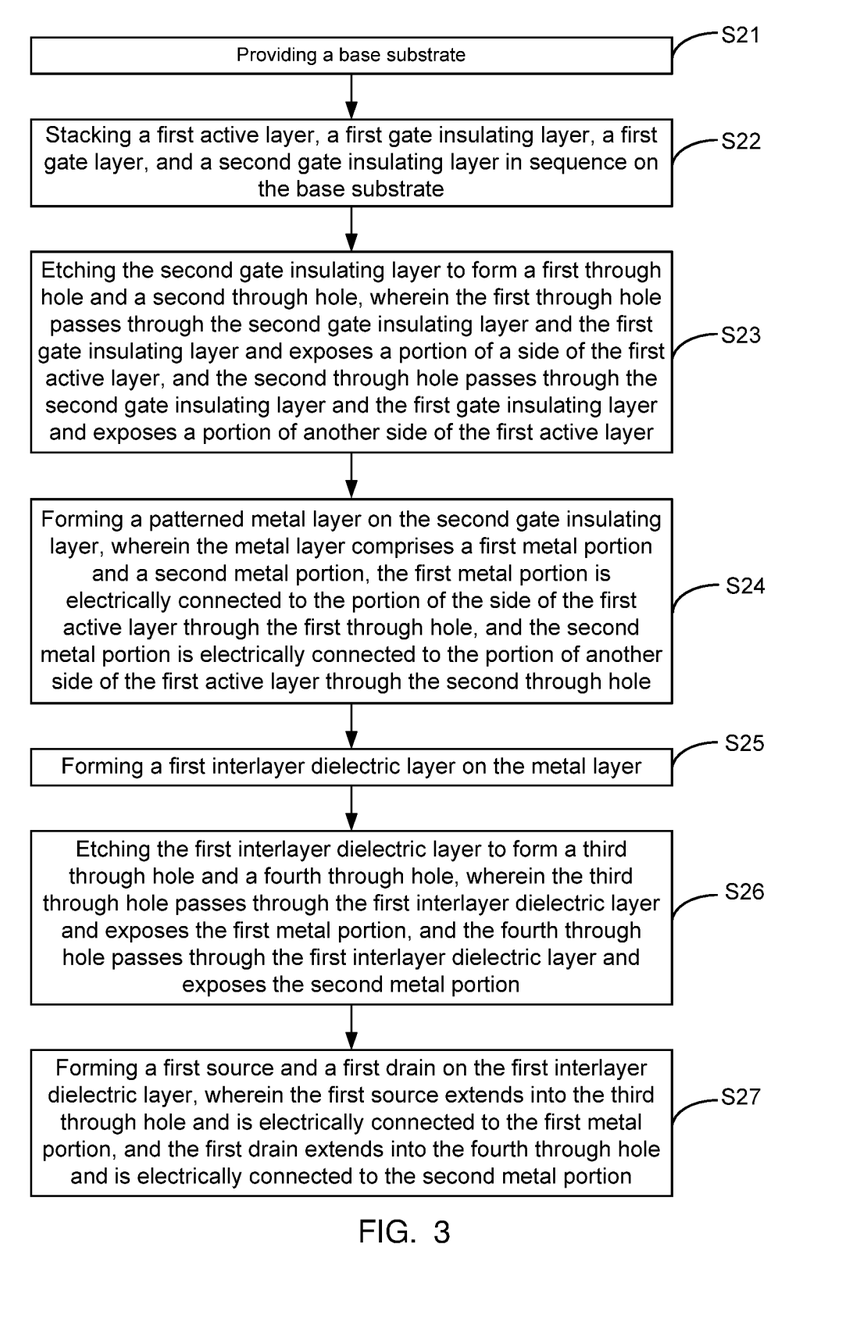
FIG. 3 is a flowchart of a manufacturing method of the display panel provided by the embodiment of the present invention.
Figure 4:
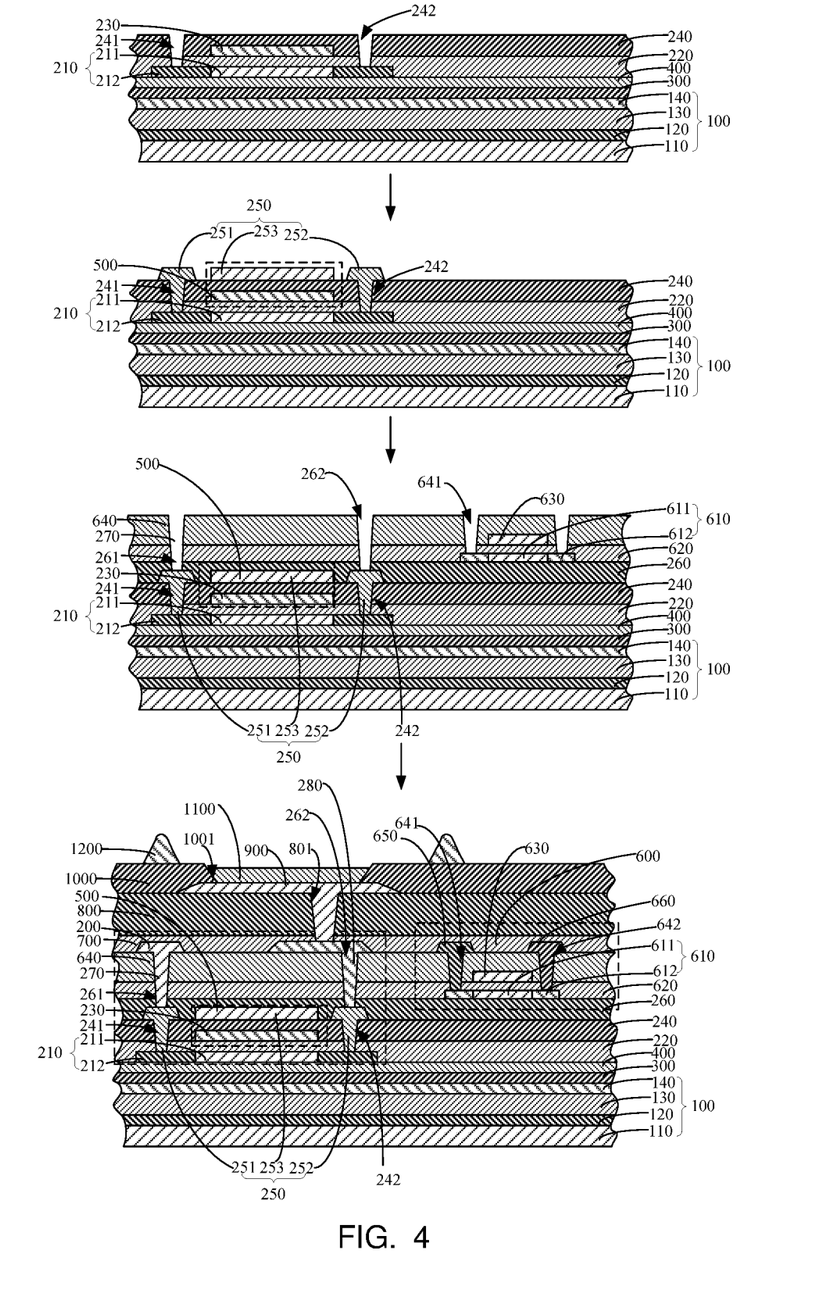
FIG. 4 is a schematic structural flow diagram of the manufacturing method of the display panel provided by the embodiment of the present invention.

Please refer to FIG. 3 and FIG. 4. FIG. 3 is a flowchart of a manufacturing method of the display panel provided by the embodiment of the present invention. FIG. 4 is a schematic structural flow diagram of the manufacturing method of the display panel provided by the embodiment of the present invention. The present invention further provides a manufacturing method of the display panel 10, which is as follows:

Step S21: providing a base substrate 100.

The base substrate 100 comprises the first flexible layer 110, the first buffer layer 120, the second flexible layer 130, and the second buffer layer 140. The first buffer layer 120 is disposed on the first flexible layer 110. The second flexible layer 130 is disposed on the first buffer layer 120. The second buffer layer 140 is disposed on the second flexible layer 130. The materials of the first flexible layer 110 and the second flexible layer 130 are polyimide or other flexible materials. The materials of the first buffer layer 120 and the second buffer layer 140 are one or a combination of SiOx and SiOy. The base substrate 100 is alternately formed with flexible layers and buffer layers, which improves the bendability of the base substrate and at the same time prevents the structure in the display panel from being corroded by water and oxygen.

After step S21, it further comprises:

Stacking a material of the first insulating layer 300 and a material of the second insulating layer 400 on the base substrate 100 in sequence to form the first insulating layer 300 and the second insulating layer 400. The materials of the first insulating layer 300 and the second insulating layer 400 is one or a combination of SiOx and SiOy. The first insulating layer 300 and the second insulating layer 400 further prevent the display panel 10 from being corroded by water and oxygen.

Step S22, stacking the first active layer 210, the first gate insulating layer 220, the first gate layer 230, and the second gate insulating layer 240 in sequence on the base substrate 100.

Specifically, the first active layer 210 is hydrogenated and activated to form the semiconductor portion 211 and the conductor portion 212. The conductor portion 212 is disposed around the semiconductor portion 211. The material of the first active layer 210 is amorphous silicon. The material of the first gate layer 230 is one or a combination of Cu, Al, and Mo.

Step S23, etching the second gate insulating layer 240 to form the first through hole 241 and the second through hole 242. The first through hole 241 passes through the second gate insulating layer 240 and the first gate insulating layer 220 and exposes the portion of the side of the first active layer 210. The second through hole 242 passes through the second gate insulating layer 240 and the first gate insulating layer 220 and exposes the portion of another side of the first active layer 210.

In an embodiment, after step S23, the method further comprises:

Cleaning the first through hole 241 and the second through hole 242 with a cleaning agent. The cleaning agent is a fluorinated hydrocarbon cleaning agent.

In the present invention, the fluorinated hydrocarbon cleaning agent is used to clean the first through hole 241 and the second through hole 242, and residual doping in the first through hole, the second through hole, and the first active layer is removed, thereby ensuring the subsequent manufacturing of the display panel, improving yield of the display panel, and reducing the production costs.

Step S24, forming a patterned metal layer 250 on the second gate insulating layer 240. The metal layer 250 comprises the first metal portion 251 and the second metal portion 252. The first metal portion 251 is electrically connected to the portion of the side of the first active layer 210 through the first through hole 241, and the second metal portion 252 is electrically connected to the portion of another side of the first active layer 210 through the second through hole 242.

Specifically, first, a metal material is deposited on the second gate insulating layer 240 to form the metal layer 250. Then, a photoresist layer is formed on the metal layer 250. Then the photoresist layer is exposed and developed to form a patterned photoresist layer. Then, using the patterned photoresist layer as a mask, the metal layer 250 is etched to form the patterned metal layer 250; finally, the photoresist layer is peeled off.

The metal layer 250 comprises the first metal portion 251, the second metal portion 252, and the third metal portion 253. The first metal portion 251 is electrically connected to the portion of the side of the first active layer 210 through the first through hole 241. The second metal portion 252 is electrically connected to the portion of another side of the first active layer 210 through the second through hole 242. The third metal portion 253 is disposed between the first metal portion 251 and the second metal portion 252 and is located on the first gate layer 230. The third metal portion 253 is insulated from the first metal portion 251 and the second metal portion 252. The first gate layer 230 and the third metal portion 253 form the storage capacitor 500.

In an embodiment, after step S24, the method further comprises:

Performing an annealing process to the first active layer 210, the first gate insulating layer 220, the first gate layer 230, the second gate insulating layer 240, and the metal layer 250 to improve characteristics of the first transistor.

Step S25, forming the first interlayer dielectric layer 260 on the metal layer 250.

In an embodiment, after step S25, the method further comprises:

Disposing a material of the second active layer 610 on the first interlayer dielectric layer 260. Expose and develop the second active layer 610 to form the second active layer 610. Then, plasma treatment is performed on the second active layer 610 to form the body portion 611 and the doped portions 612 disposed around the body portion 611. The material of the second active layer 610 is indium gallium zinc oxide (IGZO). The projections of the second active layer 610 and the first active layer 210 projected on the base substrate 100 do not overlap.

In an embodiment, after the step of disposing the second active layer 610 on the first interlayer dielectric layer 260, the method further comprises:

disposing the third gate insulating layer 620 on the first interlayer dielectric layer 260 and the second active layer 610.

Then, the second gate layer 630 is disposed on the third gate insulating layer 620. The second gate layer 630 is located on the second active layer 610.

Then, the second interlayer dielectric layer 640 is disposed on the second gate layer 630.

Step S26, etching the first interlayer dielectric layer 260 to form the third through hole 261 and the fourth through hole 262. The third through hole 261 passes through the first interlayer dielectric layer 260 and exposes the first metal portion 251. The fourth through hole 262 passes through the first interlayer dielectric layer 260 and exposes the second metal portion 252.

Specifically, the first interlayer dielectric layer 260 is etched to form the third through hole 261 and the fourth through hole 262, and the second interlayer dielectric layer 640 is etched to form the first via hole 641 and the second via hole 642. The third through hole 261 and the fourth through hole 262 passes through the second interlayer dielectric layer 640, the third gate insulating layer 620, and the first interlayer dielectric layer 260. The first via hole 641 passes through the second interlayer dielectric layer 640 and the third gate insulating layer 620 and exposes the portion of the side of the second active layer 610. The second via hole 642 passes through the second interlayer dielectric layer 640 and the third gate insulating layer 620, and exposes the portion of another side of the second active layer 610.

Step S27, forming the first source 270 and the first drain 280 on the first interlayer dielectric layer 260. The first source 270 extends into the third through hole 261 and is electrically connected to the first metal portion 251. The first drain 280 extends into the fourth through hole 262 and is electrically connected to the second metal portion 252.

Specifically, the first source 270, the first drain 280, the second source 650, and the second drain 660 are formed on the second interlayer dielectric layer 640. The first source 270 is electrically connected to the first metal portion 251. The first drain 280 is electrically connected to the second metal portion 252. The second source 650 and the second drain 660 are electrically connected to the second active layer 610 respectively.

The first active layer 210, the first gate insulating layer 220, the first gate layer 230, the second gate insulating layer 240, the first metal portion 251, the second metal portion 252, the first interlayer dielectric layer 260, the first source 270, and the second drain 280 form the first transistor 200. The first transistor 200 is the low temperature polysilicon transistor.

In an embodiment, after step S27, the method further comprises:

Forming the passivation layer 700 on the second interlayer dielectric layer 640, the first source 270, the first drain 280, the second source 650, and the second drain 660.

In an embodiment, after the step of forming the passivation layer 700 on the second interlayer dielectric layer 640, the first source 270, the first drain 280, the second source 650, and the second drain 660, further comprises:

Forming the planarization layer 800 on the passivation layer 700. The planarization layer 800 is provided with the third via hole 801. The third via hole 801 passes through the planarization layer 800 and exposes the first drain 280.

In an embodiment, after the step of forming the planarization layer 800 on the passivation layer 700, further comprises:

Disposing the anode layer 900 on the planarization layer 800. The anode layer 900 extends into the third via hole 801 to be electrically connected to the first drain 280.

In an embodiment, after the step of disposing the anode layer 900 on the planarization layer 800, further comprises:

Forming the pixel definition layer 1000 on the planarization layer 800 and the anode layer 900. The pixel definition layer 1000 is provided with the fourth via hole 1001, and the fourth via hole 1001 passes through the pixel definition layer 1000 to expose the anode layer 900.

In an embodiment, after the step of forming the pixel definition layer 1000 on the planarization layer 800 and the anode layer 900, the method further comprises:

Disposing the light-emitting portion 1100 in the fourth via hole 1001 to electrically connect to the anode layer 900.

In an embodiment, after the step of disposing the light-emitting portion 1100 in the fourth via hole 1001, the method further comprises:

Disposing the retaining wall 1200 on the pixel definition layer 1000, wherein the retaining wall 1200 is located around the fourth via hole 1001.

The present invention provides the manufacturing method of the display panel. The first through hole and the second through hole are respectively filled with the first metal portion and the second metal portion electrically connected to the first active layer. Then, the first source and the first drain connected to the first metal portion and the second metal portion are respectively filled in the third through hole and the fourth through hole to prevent damage to the first active layer by the deep-hole process, thereby preventing the abnormal electrical connection between the first source, the first drain, and the first active layer. Pre-preparation of the first metal portion and the second metal portion in the first through hole and the second through hole prevents damage to the second active layer during the cleaning and annealing of the first through hole and the second through hole, which leads to the abnormal electrical connection between the second source, the second drain, and the second active layer, thus reducing the difficulty of manufacturing low temperature polysilicon transistors and metal oxide transistors in the display panel and ensuring the display performance and cost reduction of the display panel.

The present invention provides the display panel and the manufacturing method thereof. The first metal portion and the second metal portion are electrically connected to the first active layer, and then the first source and the first drain are electrically connected to the first active layer through the first metal portion and the second metal portion. This prevents the damage to the exposed first active layer in a subsequent manufacturing process, thereby ensuring the display performance of the display panel and reducing difficulty of the manufacturing process.

The embodiments of the present invention are described in detail above. In the article, specific examples are used to illustrate the principle and implementation of the present invention. The description of the above embodiments is only used to help understand the technical solutions and core ideas of the present invention. Those of ordinary skill in the art should understand that they can still modify the technical solutions described in the foregoing embodiments, or equivalently replace some of the technical features. However, these modifications or replacements do not make the essence of the corresponding technical solutions deviate from the scope of the technical solutions of the embodiments of the present invention.

What is claimed is:

1. A manufacturing method of a display panel, comprising following steps:
   providing a base substrate;
   stacking a first active layer, a first gate insulating layer, a first gate layer, and a second gate insulating layer in sequence on the base substrate;
   etching the second gate insulating layer to form a first through hole and a second through hole, wherein the first through hole passes through the second gate insulating layer and the first gate insulating layer and exposes a portion of a side of the first active layer, and the second through hole passes through the second gate insulating layer and the first gate insulating layer and exposes a portion of another side of the first active layer;
   forming a patterned metal layer on the second gate insulating layer, wherein the metal layer comprises a first metal portion and a second metal portion, the first metal portion is electrically connected to the portion of the side of the first active layer through the first through hole, and the second metal portion is electrically connected to the portion of another side of the first active layer through the second through hole;
   forming a first interlayer dielectric layer on the metal layer;
   disposing a second active layer on the first interlayer dielectric layer, wherein projections of the second active layer and the first active layer projected on the base substrate do not overlap;

disposing a third gate insulating layer on the first interlayer dielectric layer and the second active layer;

disposing a second gate layer on the third gate insulating layer;

etching the first interlayer dielectric layer to form a third through hole and a fourth through hole, wherein the third through hole passes through the first interlayer dielectric layer and exposes the first metal portion, and the fourth through hole passes through the first interlayer dielectric layer and exposes the second metal portion; and forming a first source and a first drain on the first interlayer dielectric layer, wherein the first source extends into the third through hole and is electrically connected to the first metal portion, and the first drain extends into the fourth through hole and is electrically connected to the second metal portion.

2. The manufacturing method of the display panel as claimed in claim 1, wherein after the step of etching the second gate insulating layer to form the first through hole and the second through hole, and before the step of forming the patterned metal layer on the second gate insulating layer, the method further comprises:

cleaning the first through hole and the second through hole.

3. The manufacturing method of the display panel as claimed in claim 1, wherein after the step of disposing the second active layer on the first interlayer dielectric layer, the method further comprises:

disposing a second interlayer dielectric layer on the second gate layer, wherein the third through hole and the fourth through hole further pass through the third gate insulating layer and the second interlayer dielectric layer; and forming the first source, the first drain, a second source, and a second drain on the second interlayer dielectric layer, wherein the first source is electrically connected to the first metal portion, the first drain is electrically connected to the second metal portion, and the second source and the second drain are electrically connected to the second active layer.

4. The manufacturing method of the display panel as claimed in claim 3, wherein after the step of forming the first source, the first drain, the second source, and the second drain on the second interlayer dielectric layer, the method further comprises:

forming a passivation layer on the second interlayer dielectric layer, the first source, the first drain, the second source, and the second drain.

5. The manufacturing method of the display panel as claimed in claim 4, wherein after the step of forming the passivation layer on the second interlayer dielectric layer, the first source, the first drain, the second source, and the second drain, the method further comprises:

forming a planarization layer on the passivation layer, wherein the planarization layer is provided with a third via hole, and the third via hole passes through the planarization layer and exposes the first drain.

6. The manufacturing method of the display panel as claimed in claim 5, wherein after the step of forming the planarization layer on the passivation layer, the method further comprises:

disposing an anode layer on the planarization layer, wherein the anode layer extends into the third via hole to be electrically connected to the first drain.

7. The manufacturing method of the display panel as claimed in claim 3, wherein after the step of disposing the anode layer on the planarization layer, the method further comprises:

forming a pixel definition layer on the planarization layer and the anode layer, wherein the pixel definition layer is provided with a fourth via hole, and the fourth via hole passes through the pixel definition layer to expose the anode layer.

\* \* \* \* \*